(12) United States Patent
Merkel et al.

(10) Patent No.: US 9,169,552 B2
(45) Date of Patent: Oct. 27, 2015

(54) PROCESS FOR DEPOSITING CERAMIC OR ORGANOCERAMIC MATERIAL ON A SUBSTRATE

(75) Inventors: Till Merkel, Neu-Ulm (DE); Christian Lehnert, Ulm (DE)

(73) Assignee: WIELAND-WERKE AG, Ulm (DE)

( * ) Notice: Subject to any disclaimer, the term of this patent is extended or adjusted under 35 U.S.C. 154(b) by 602 days.

(21) Appl. No.: 13/394,013

(22) PCT Filed: Aug. 19, 2010

(86) PCT No.: PCT/EP2010/005080
§ 371 (c)(1),
(2), (4) Date: May 10, 2012

(87) PCT Pub. No.: WO2011/026565
PCT Pub. Date: Mar. 10, 2011

(65) Prior Publication Data
US 2012/0219711 A1 Aug. 30, 2012

(30) Foreign Application Priority Data
Sep. 4, 2009 (DE) .......................... 10 2009 040 165

(51) Int. Cl.
C23C 2/40 (2006.01)
C23C 16/40 (2006.01)
C23C 16/448 (2006.01)
C23C 16/455 (2006.01)

(52) U.S. Cl.
CPC ........... C23C 16/402 (2013.01); C23C 16/4488 (2013.01); C23C 16/45512 (2013.01)

(58) Field of Classification Search
CPC .... C23C 16/30; C23C 16/402; C23C 16/448; C23C 16/455; C23C 16/45512
See application file for complete search history.

(56) References Cited

U.S. PATENT DOCUMENTS

| 3,556,841 | A | | 1/1971 | Iwasa et al. |
| 5,360,646 | A | * | 11/1994 | Morita .......................... 438/789 |
| 5,470,800 | A | | 11/1995 | Muroyama |
| 5,840,631 | A | | 11/1998 | Kubo et al. |
| 6,022,812 | A | | 2/2000 | Smith et al. |
| 6,495,208 | B1 | * | 12/2002 | Desu et al. ............... 427/255.31 |
| 2010/0021632 | A1 | * | 1/2010 | Biedermann et al. .... 427/255.37 |

FOREIGN PATENT DOCUMENTS

| DE | 10 2007 010 995 A1 | | 9/2008 |
| DE | 102007010995 A1 | * | 9/2008 |
| JP | 2006-040936 | | 2/2006 |

OTHER PUBLICATIONS

International Search Report from International Application No. PCT/EP2010/005080 mailed Sep. 24, 2010 (3 pages).

* cited by examiner

*Primary Examiner* — David Turocy
(74) *Attorney, Agent, or Firm* — Flynn, Thiel, Boutell & Tanis, P.C.

(57) ABSTRACT

A process for the application of layers composed of ceramic or organoceramic materials on surfaces of metals, semimetals or compounds thereof and also components or assemblies made of these materials by a chemical deposition process from the gas phase at atmospheric pressure or 30% below this and process temperatures during deposition below 500° C. The deposition process is carried out in one operation, wherein the reactive chemical substances and the precursors are homogeneously backmixed in the common gas space, and the average residence time as a ratio of volume of the gas space to gas throughput is matched to the rate-determining step of the catalyzed gas-phase reaction of the coating process so as to achieve a deposition rate of from 10 to 2000 nm per hour.

9 Claims, No Drawings

PROCESS FOR DEPOSITING CERAMIC OR ORGANOCERAMIC MATERIAL ON A SUBSTRATE

The invention relates to a process for the application of layers.

Processes for the deposition of solid phases by means of a chemical reaction of a precursor in a coating chamber are widespread for coating metal tools with hard material coatings. Semimetals and ceramics for semiconductor production or for photovoltaics are, for example, coated with oxide ceramics such as $SiO_2$. Such processes typically operate at a reduced pressure in the range from $10^{-1}$ to 100 mbar. A distinction is made between high-temperature processes (temperatures above 900° C.) and intermediate-temperature processes (temperatures of from 700 to 900° C.)

On the other hand, to introduce the energy necessary for the activation of chemical transformations into the system in the case of low-temperature processes (from room temperature to 500° C.), the pressure is reduced to from $10^{-1}$ to 10 mbar and a plasma is frequently employed for introduction of energy.

As precursors for tool coating, chlorides of silicon, titanium or aluminum, for example, are brought into the gas phase in low-pressure processes and in high-temperature processes reacted with nitrogen or oxygen to form nitrides or oxides. For the application of oxide ceramics such as $SiO_2$ to silicon, use is made of hydrides, chlorides or silicon-organic compounds which react at pressures below 1 mbar and temperatures above 400° C. Process temperatures just below 400° C. are possible when a plasma is additionally employed. Deposition of $SiO_2$ from silicon-organic compounds such as tetraethyl orthosilicate (TEOS) in the gas phase can occur even at atmospheric pressure and temperatures of from 420 to 450° C. in an oxidative environment such as oxygen or ozone. The deposition of $ZrO_2$ can also be achieved at atmospheric pressure and temperatures below 400° C. in a hydrolysis reaction when a hydrolysis-sensitive precursor from the class of alkyl-alkoxy compounds such as zirconium acetylacetonate is used.

The conversions of hydrolysis reactions of weakly hydrolysis-susceptible precursors such as tetraalkoxy compounds (e.g. TEOS) are sufficient for economical operation of the process only at high temperatures. The use of suitable catalysts enables the conversions to be accelerated, for example in the reaction of TEOS with water. This is utilized industrially in sol-gel processes in the liquid phase. It is also possible to generate a vapor from a mixture of TEOS, water and catalyst in the liquid phase in order to deposit $SiO_2$ in a downstream coating chamber.

Such layers can be utilized for protecting objects against corrosion, generally to form a barrier against undesirable diffusion and to carry out optical functions as interference layers. Silicon dioxide layers are also considered for purposes of electrical insulation and are employed, inter alia, when high breakdown field strengths are to be achieved in electronic components.

In this context, a process and an apparatus for applying transparent silicon dioxide layers from the gas phase is also known from DE 10 2007 010 995 A1. In this deposition process from the gas phase, in which precursors are introduced by means of a carrier gas into an oven, a liquid-phase process precedes the gas-phase process. A sol-gel process starting out from silicon-containing starting chemicals is used as liquid-phase process. However, the liquid-phase process is in this case stopped prematurely in the sol state by vaporizing the precursors for coating formed in the liquid phase from the reaction mixture, mixing them with carrier gas and transporting them to the furnace. Polymerization reactions in the liquid phase influence the process stability. The feed lines to the coating chamber are coated on the inside, these coatings flake off and are introduced as solid particles into the coating chamber and are there deposited on the surfaces of the workpieces to be coated. This leads to formation of defects.

Another document U.S. Pat. No. 6,022,812 describes a process in which liquid and gaseous substances are likewise used. Here, a silicon-organic compound is applied in the liquid form to a surface and then exposed to a gas atmosphere consisting of acid vapor and water vapor. Thin films can be produced in this way, and for greater layer thicknesses this procedure has to be repeated a number of times. Dip-coated processes also operate according to this principle.

Pure gas-phase processes for coating semiconductors in an oxidizing atmosphere are likewise already known. The document, U.S. Pat. No. 5,840,631 describes a two-step process for the deposition of $SiO_2$ at 400° C. In the first step, a gaseous silicon-organic compound is reacted with ozone and water vapor. A second layer of the coating, whose properties are controlled by use of a catalyst, is applied on top of this. The strong unstable oxidant ozone used imposes demanding requirements in terms of apparatus when combined with combustible and explosive compounds such as tetraethyl orthosilicate (TEOS). The process gas is highly reactive and at the volume flows indicated has a residence time in the vicinity of the component to be coated of a few seconds.

A single-step coating process as per U.S. Pat. No. 3,556,841, in which acetic acid and tetraethyl orthosilicate are reacted in the gas phase, leads to significant conversions at temperatures above 440° C. In another process according to U.S. Pat. No. 5,360,646, three reactive components are mixed directly above the substrate to be coated and are, in a nitrogen carrier gas stream, brought into contact once with the substrate. The coating process proceeds at from 250 to 350° C. when high partial pressures of acetic acid and water are set at low TEOS contents.

It is an object of the invention to develop a low-temperature process for the application of layers to surfaces of metal so as to allow, by means of simple plant technology, coating of complex components in one operation, does not lead to microstructural changes in metallic materials and achieves economical deposition rates with sparing use of process chemicals.

The invention encompasses a process for the application of layers of ceramic or organoceramic materials to the surfaces of metals, semimetals or compounds thereof and also components or assemblies made from these materials by means of a chemical deposition process from the gas phase at atmospheric pressure or 30% below this and process temperatures during deposition below 500° C. In the process, the reactive chemical substances used for layer formation from the gas phase are formed from a plurality of precursors by a catalyst gas-phase reaction. The preceding catalyzed gas-phase reaction and the deposition process proceed in a common gas space. The deposition process is carried out in one operation in which the reactive chemical substances and the precursors are homogeneously backmixed in a common gas space and the average residence time of the process gas as a ratio of volume of the gas space to gas throughput is matched to the rate-determining step of the catalyzed gas-phase reaction of the coating process in order to achieve a deposition rate of from 10 to 2000 nm per hour.

Preferred deposition rates are in the range from 50 to 200 nm per hour. To set the desired deposition rates, a gas throughput which results in a sufficient average residence time is, for example, selected on the basis of the half-lives of the total reaction chain.

For the purposes of the invention, ceramic materials are materials whose chemical composition corresponds, in particular, to the composition of technical ceramics; these materials can, depending on the process conditions, be present in crystalline form, partially crystalline form, amorphous form or as glasses after the coating process. If organic functions have been introduced into the ceramic materials by choice of suitable precursors, these are referred to as organoceramic materials.

The invention provides a novel coating process in the field of MOCVD (metal-organic chemical vapor deposition) by means of which heat-sensitive substrates can also be coated.

The invention proceeds from the idea that ceramic or organoceramic materials can be deposited on metal, semimetals or compounds thereof, for example alloys, oxides, sulfides, carbides, etc, by means of a catalyzed gas-phase reaction. Component surfaces composed of the abovementioned materials are also possible for the coating. Components having, in particular, a complex geometry of the surfaces, for example cavities, undercuts, interior spaces, etc, are of particular interest for coating by means of the process described. Here, electrical, magnetic, thermal, optical, tribological, mechanical or chemical properties can be optimized.

The deposition process of the invention takes place entirely in the gas phase. Here, the precursors react with one another in the gas phase, form a likewise gaseous intermediate and this then decomposes at temperatures below 500° C. This decomposition reaction leads to formation of a solid layer; economically interesting coating rates of above 50 nm/min can be achieved only when relatively high concentrations of the gaseous intermediates can be provided. The formation of these intermediates is the rate-determining step of the overall process. For example, the precursors are a silicon-organic compound such as TEOS, water and a catalyst. At temperatures above 250° C., this decomposition leads to formation of a firmly adhering thin layer on the surface of the substrate. Metals such as aluminum, copper, iron or alloys thereof and also semimetals such as silicon can serve as a substrate. These layers can also be applied to the compounds of the substrates mentioned, for example oxides or sulfides. When the precursor TEOS is used, the solid reaction product is an $SiO_2$ layer.

The layers according to the invention can be deposited on the indicated materials and components in a thickness in the range from 1 to 5000 nm, preferably in the range from 50 to 1000 nm, even at deposition rates in the range from 500 to 5000 nm/h. The economics are ensured by the use of available plant technology and intrinsically safe chemicals.

The particular advantage is that coating of metals and semiconductors and complex components and also hollow bodies is made possible by high deposition rates as long as high concentrations of the highly reactive intermediate can be achieved. Deposition on relatively complex ceramics in the field of photovoltaics or on superconductors or when using suitable precursors for building up complex ceramics is also possible.

Preferred average residence times of the process gas in the gas space can be greater than 2 minutes. However, the average residence times may also exceed 10 minutes or 20 minutes. The longer times can ultimately occur, in particular, in the case of deposition at relatively low temperatures. At relatively low temperatures, the conversion of the precursors used for layer formation from the gas phase will proceed more slowly. Overall, the deposition rate therefore also decreases, as a result of which a longer average residence time of the backmixed gas species in the gas space can also be set owing to the lower total conversion.

In a preferred embodiment of the invention, the process temperature during layer formation can be selected in the range from 100 to 450° C. The deposition process thus also makes it possible to coat copper materials as metallic substrates which are heat treated at temperatures above 450° C. in order to set mechanical properties which are not changed or adversely affected during the deposition of the layer because of the low process temperatures.

In a further advantageous embodiment of the invention, the process temperature during layer formation can be selected in the range from 250 to 400° C. Lowering of the temperature in the reaction space to values below 400° C. makes it possible also to treat light metals such as aluminum which, owing to their low melting points, cannot be treated at atmospheric pressure by means of conventional CVD processes. Lower temperatures slow the rate-determining step which leads to formation of the highly reactive intermediate but increases the life of the latter. This is a prerequisite for coating complex parts around which the process gas is forcibly circulated. In the case of the precursor TEOS, for example, a lowering of the process temperature to below 250° C. is not appropriate because of the lower deposition rates determined by the reaction kinetics when the activation energy for the chemical reaction is introduced exclusively via thermal energy. Introduction of the activation energy from other energy sources such as a plasma would allow a further decrease in the temperature while maintaining a satisfactory deposition rate.

The precursors for formation of the reactive chemical substances can advantageously be reacted in a catalyzed hydrolysis reaction. Suitable precursors are, in particular, compounds which can easily be decomposed by means of water. This class of substances includes, inter alia, typical precursors for plasma-assisted CVD processes (PACVD or PECVD), for example hexamethyldisiloxane (HMDSO) or tetraalkoxysilanes such as TEOS. Compared to the alkyl-alkoxy compounds such as HMDSO, the tetraalkoxysilanes such as TEOS are more stable in respect of thermal decomposition in the coating chamber. This makes it possible for the process of the invention to be carried out economically using TEOS in a hydrolysis reaction only with the aid of a catalyst.

Furthermore, the precursors can advantageously be reacted in an acid- or base-catalyzed hydrolysis reaction. When carrying out sol-gel processes in the liquid phase, the catalytic action of acidic or alkaline additives is employed. When acids such as hydrofluoric acid, nitric acid, sulfuric acid or acetic acid or alkalis such as sodium hydroxide or ammonia are used, the gel formation times as a measure of the reaction rate in the sol-gel process are significantly shortened. The choice of a suitable catalyst on the basis of its acid/base strength also enables the condensation reactions commencing after gel formation to be accelerated or retarded in the liquid phase. Application of this concept to acid- or base-catalyzed hydrolysis in the gas phase enables high coating rates to be achieved even at low process temperatures below 400° C. when the partial pressures of catalyst and water vapor and the residence time as a ratio of volume flow of the process gas to volume of the reaction space are matched to one another. Advantageous residence times are above 2 minutes, with preference being given to relatively long residence times of greater than 20 minutes.

In an advantageous embodiment of the invention, the catalyzed gas-phase reaction for producing the reactive chemical substances required for layer formation can take place in the same gas space in which the coating of the surface is also carried out. For an economical process, it is useful to combine the chemical reactions, namely both the decomposition reaction of an intermediate leading to layer formation and also the preceding reaction steps, for example in the case of the acid-catalyzed hydrolysis of TEOS from protonation through to formation of the unstable intermediates, in one reaction space. This avoids, in particular, formation of solid phases on the surfaces or in the gas phase in lines or mixing zones outside the coating chamber.

As an alternative, it is also possible for the catalyzed gas-phase reaction for producing the reactive chemical substances required for layer formation to be carried out in an upstream first gas space from which the reactive chemical substances are then introduced into a second gas space in which coating of the surface is carried out. In the case of the acid-catalyzed hydrolysis of alkoxy compounds, for example TEOS, with a subsequent decomposition reaction of the intermediate, the actual decomposition reaction is preceded by a number of prereactions. Owing to the low process temperatures, the rate of the overall process is limited by the kinetics of the chemical reaction and is thus reaction-controlled. In order to optimize the process, it can be useful to allow the preceding reactions to proceed outside the coating chamber under controlled conditions in respect of temperature and flow and also residence time. This advantageously occurs, for example, in a reaction space configured as a heated capillary reactor, tube reactor containing a catalyst bed or an immobilized catalyst upstream of the coating chamber. In this way, it is possible to ensure that the preceding reactions are largely complete so that the gas entering the coating chamber contains a high proportion of the highly reactive intermediate which then decomposes in the coating chamber. This enables process times to be effectively shortened and conversions and yields of the chemicals used to be optimized.

In an advantageous embodiment of the invention, alkoxy, carboxy and/or unsubstituted, partially substituted or fully substituted alkyl-alkoxy or alkyl-carboxy compounds can be used as precursors. To form oxide ceramics, the use of precursors whose central atom, for example silicon, titanium, aluminum or zirconium, is already largely surrounded by the later bonding partner oxygen is useful. Examples of such compounds are the alkoxy compounds of silicon, e.g. tetraethoxysilane (TEOS) or tetramethoxysilane (TMOS). To set particular properties of the deposited layers, it can be useful to integrate organic functions into the layers. This can be achieved, for example, by the central atoms not being completely surrounded by alkoxy radicals but instead individual organic radicals being formed by only alkyl groups, for example as in the case of triethoxyethylsilane. The effect of such functions can be controlled by varying the chain length of these alkyl groups or the complete or partial replacement of the hydrogen atoms in the alkyl group by other atoms, for example fluorine. Analogous considerations apply to the use of carboxy compounds, for example dihydroxyaluminum acetate.

In a particularly advantageous embodiment of the invention, alkoxy, carboxy and/or unsubstituted, partially substituted or fully substituted alkyl-alkoxy or alkyl-carboxy compounds of silicon, aluminum, titanium or zirconium can be used as precursors. Important industrial fields of application of the process are the deposition of oxide ceramics of silicon, aluminum, titanium or zirconium. Suitable precursors such as TEOS as silicon-organic compound, dihydroxyaluminum acetate and aluminum triethoxide as aluminum-organic compounds, tetraisopropoxytitanium as titanium-organic compound or zirconium ethoxide as zirconium-organic compound are available for these processes. However, these considerations can likewise be applied to other oxide ceramics based on yttrium or lanthanum.

The economics of the process is determined by the conversion of the chemical reaction, the consumption of chemicals used and the life of the plants. Achievement of longer residence times of the process gas in the fully backmixed gas space results in better utilization of the chemicals used and enables the consumption of catalyst and water to be reduced. Thus, in a preferred embodiment of the process, molar ratios of the starting chemicals TEOS, acetic acid and water of 1:1-5:1-5 have been found to be useful when they are combined with relatively long residence times. The small proportion of acetic acid considerably reduces the corrosive attack of the process gases on plant components and thus increases their life and thus improves the economics of the process.

The precursors used can advantageously be largely stable, transportable and storable at room temperature and not form any explosive mixtures with air. Atmospheric CVD processes frequently have a higher gas throughput because of the higher process pressures compared to vacuum-based processes. The process offgases produced therefore have to be disposed of with a small outlay in terms of engineering and especially safety precautions. An increased consumption also means maintenance of a larger stock of the precursors. This places demanding safety and environmental requirements on supply and disposal. A variant of the process of the invention using the precursors TEOS, acetic acid and water has proved to be particularly advantageous here. These substances are largely stable on storage at room temperature and do not form any explosive mixtures with air. The process offgases are quantitatively condensed as a liquid from the offgas and can, after conclusion of the condensation reaction, be disposed of inexpensively as solid waste. Complicated gas purification processes such as burners, scrubbers or absorber cartridges can be dispensed with in this way.

In a particularly advantageous example of implementation of the deposition process of the invention, TEOS and water were, in particular, vaporized separately with the catalyst acetic acid and reacted with one another in the gas phase. In a reaction proceeding via a plurality of steps (protonation, nucleophilic attack, formation of an unstable intermediate such as a silanol), $SiO_2$ was then deposited in the coating chamber. When the proportion of water in the gas phase was doubled, deposition rates of over 2000 nm/h could be realized. In the case of vaporization from a sol of the substances mentioned and subsequent introduction into a coating chamber, deposition rates in the region of only 100 nm/h were achieved.

The invention claimed is:

1. A process for forming layers containing a ceramic or organoceramic material on the surface of a metal, semimetal or compounds thereof comprising a step of forming the layers containing a ceramic or organoceramic material on the surface of the metal, semimetal or compound thereof by a chemical deposition process conducted at a temperature less than 500° C. and a pressure no greater than atmospheric, wherein
reactive chemical substances used for layer formation from the gas phase are formed from tetraethyl orthosilicate, acetic acid and water in a ratio of 1:1-5:1-5 as precursors by a catalyzed gas-phase reaction,
the catalyzed gas phase reaction and the deposition process proceed in a fully backmixed common gas space,
the deposition process is carried out in one operation,
the reactive chemical substances and the precursors are homogeneously backmixed in the fully backmixed common gas space and the average residence time, as a ratio of volume of the gas space to gas throughput, is matched to a rate-determining step of the catalyzed gas-phase reaction to achieve a deposition rate of from 10 to 2,000 nm/hr, with the average residence time of process gas in the backmixed gas space being greater than two minutes.

2. The process according to claim 1, characterized in that the average residence time of process gas in the backmixed gas space is greater than 10 minutes.

3. The process according to claim 1, characterized in that the average residence time of process gas in the backmixed gas space is greater than 20 minutes.

4. The process according to claim 1, characterized in that the process temperature during layer formation is from 100 to 450° C.

5. The process according to claim 4, characterized in that the process temperature during layer formation is from 250 to 400° C.

6. The process according to claim 1, characterized in that the precursors for formation of the reactive chemical substances are reacted in a catalyzed hydrolysis reaction.

7. The process according to claim 6, characterized in that the precursors are reacted in an acid- or base-catalyzed hydrolysis reaction.

8. The process according to claim 1, characterized in that the precursors used are stable, transportable and storable at room temperature and do not form an explosive mixtures with air.

9. The process according to claim 1, wherein the pressure is 30% below atmospheric.

* * * * *